United States Patent
Sasaki et al.

(10) Patent No.: US 10,910,043 B2
(45) Date of Patent: Feb. 2, 2021

(54) SEMICONDUCTOR MEMORY DEVICE

(71) Applicant: TOSHIBA MEMORY CORPORATION, Tokyo (JP)

(72) Inventors: Shinichi Sasaki, Tokyo (JP); Daisuke Miyashita, Kawasaki Kanagawa (JP); Jun Deguchi, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/556,288

(22) Filed: Aug. 30, 2019

(65) Prior Publication Data

US 2020/0219560 A1 Jul. 9, 2020

(30) Foreign Application Priority Data

Jan. 8, 2019 (JP) .................................. 2019-001136

(51) Int. Cl.
| | |
|---|---|
| *G11C 11/56* | (2006.01) |
| *G11C 13/00* | (2006.01) |
| *G11C 16/26* | (2006.01) |
| *G11C 16/10* | (2006.01) |

(52) U.S. Cl.
CPC .......... *G11C 11/5621* (2013.01); *G11C 11/56* (2013.01); *G11C 11/5642* (2013.01); *G11C 11/5678* (2013.01); *G11C 13/004* (2013.01); *G11C 13/0069* (2013.01); *G11C 16/10* (2013.01); *G11C 16/26* (2013.01)

(58) Field of Classification Search
CPC .. G11C 11/56; G11C 11/5621; G11C 11/5642
USPC ..................... 365/168, 185.03, 208
See application file for complete search history.

(56) References Cited

U.S. PATENT DOCUMENTS

| | | | | |
|---|---|---|---|---|
| 5,424,989 A | * | 6/1995 | Hagiwara | ............... G11C 29/24 |
| | | | | 365/201 |
| 5,515,321 A | * | 5/1996 | Hazama | ............... G11C 11/5621 |
| | | | | 365/185.19 |
| 7,304,889 B2 | * | 12/2007 | Goldman | .................. G11C 7/06 |
| | | | | 365/185.03 |
| 8,355,284 B2 | | 1/2013 | Dudte et al. | |
| 8,363,486 B2 | * | 1/2013 | Abiko | .................... G11C 16/26 |
| | | | | 365/189.05 |
| 2013/0214760 A1 | | 8/2013 | Hancock | |

FOREIGN PATENT DOCUMENTS

| | | |
|---|---|---|
| JP | 2009537935 | 10/2009 |
| JP | 2016212938 A | 12/2016 |

* cited by examiner

*Primary Examiner* — Son L Mai (74) *Attorney, Agent, or Firm* — Holtz, Holtz & Volek PC (57) ABSTRACT

According to one embodiment, a semiconductor memory device includes a memory, a controller, and a sense amplifier. The memory includes a plurality of memory cells, wherein each of the memory cells can store a multi level indicating one data. The controller writes the multi level to one cell of the memory. The sense amplifier performs unary read of data from the multi level written in the one cell. The data is data in which an error of a predetermined lower significant bit is allowed. The controller reads data indicated by the multi level stored in the one cell of the memory from the sense amplifier.

4 Claims, 7 Drawing Sheets

SEMICONDUCTOR MEMORY DEVICE

CROSS-REFERENCE TO RELATED APPLICATIONS

This application is based upon and claims the benefit of priority from Japanese Patent Application No. 2019-001136, filed Jan. 8, 2019, the entire contents of which are incorporated herein by reference.

FIELD

Embodiments described herein relate generally to a semiconductor memory device.

BACKGROUND

A huge amount of data is consumed in deep learning. In data (e.g., weight data) used in deep learning, an upper significant bit may have a higher significance as compared with a lower significant bit. However, even such data has been controlled so that the reliability of all the bits are equal in a conventional memory system.

Usually, in a memory system, data is controlled by an ECC (Error Correcting Code) so that the reliability is uniform in all the bits. However, as the number of bits stored in one memory cell increases, the cost required for the ECC increases.

There is a technique of performing control by weighting the reliability in a plurality of bits included in a multi level memory cell. In this technique, however, errors in output data increase when influenced by noise at the time of sensing current or voltage.

DETAILED DESCRIPTION

In general, according to one embodiment, a semiconductor memory device includes a memory, a controller, and a sense amplifier. The memory includes a plurality of memory cells, wherein each of the memory cells can store a multi level indicating one data. The controller writes the multi level to one cell of the memory. The sense amplifier performs unary read of data from the multi level written in the one cell. The data is data in which an error of a predetermined lower significant bit is allowed. The controller reads data indicated by the multi level stored in the one cell of the memory from the sense amplifier.

Hereinafter, the embodiments will be described with reference to the drawings. In the following descriptions, structural elements having substantially the same function and configuration will be assigned with the same reference numeral. As necessary, such elements may be described in duplicate. The technical ideas of the embodiments embrace various modifications within the scope of claims.

Each of the function blocks can be implemented in the form of hardware, computer software, or a combination thereof. Thus, each block is explained below generally from the viewpoint of its function so that it can be implemented in any of the above forms. Whether such functions are implemented as hardware or software depend on specific embodiments or design restrictions imposed on the entire system. Although a person with ordinary skill in the art can realize these functions by various kinds of methods for each specific embodiment, determining such realization is included in the scope of the present invention.

First Embodiment (1-1) Configuration

In the embodiments, in order to reduce the ECC cost and the influence of sensing noise, data in which errors are allowable within a certain range is written in a multi level memory. As this kind of data, for example, there is data (e.g., weight coefficient) for inference of deep learning. To read the data, a sense amplifier that performs unary read is used.

Figure 1:
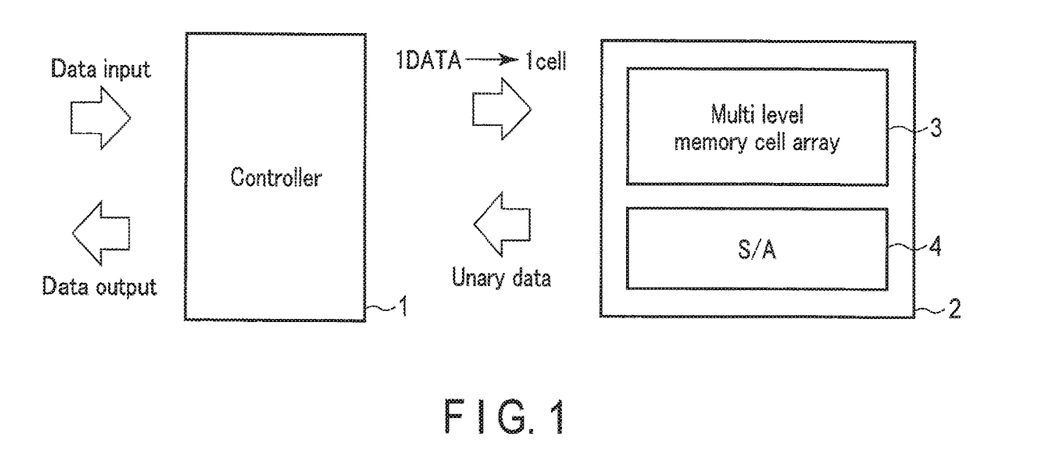
FIG. 1 is a diagram for explaining a semiconductor memory device according to a first embodiment.

FIG. 1 is a diagram for explaining the semiconductor memory device according to the first embodiment.

As shown in FIG. 1, the semiconductor memory device according to the first embodiment includes a controller 1, and a memory 2 connected to the controller 1.

The controller 1 writes a multi level indicating one data to one cell of a multi level memory cell array 3 of a memory 2. Herein, data is 0 to m (m is an integer of 2 or more).

Data (data in which an error of a predetermined lower significant bit is allowable) in which errors in a certain range are allowable, such as data for inference of deep learning, is input to the controller 1. For the input data, the controller 1 writes a multi level indicating one data to one cell of the multi level memory cell array 3.

The sense amplifier (S/A) 4 reads a multi level indicating one data written in one cell of the multi level memory cell array 3 as unary data by unary read. At this moment, the unary data may have been binary-coded.

The controller 1 reads the data (unary data) indicated by the multi level which is unary-read by the sense amplifier (S/A) 4 and stored in one cell of the multi level memory cell array 3.

The memory 2 includes the multi level memory cell array 3 and the sense amplifier 4.

The multi level memory cell array 3 includes a plurality of memory cells arranged in an array pattern. Each memory cell can store a multi level. This memory 2 is, for example, a multi level memory, such as a NAND flash memory, a resistance change type memory (ReRAM), and a phase change memory (PCM).

The sense amplifier (S/A) 4 performs unary read of data from a multi level indicating data and stored in one cell of the multi level memory cell array 3. This sense amplifier 4 is, for example, a single slope ADC (single slope AD converter) or a flash ADC.

Figure 2:
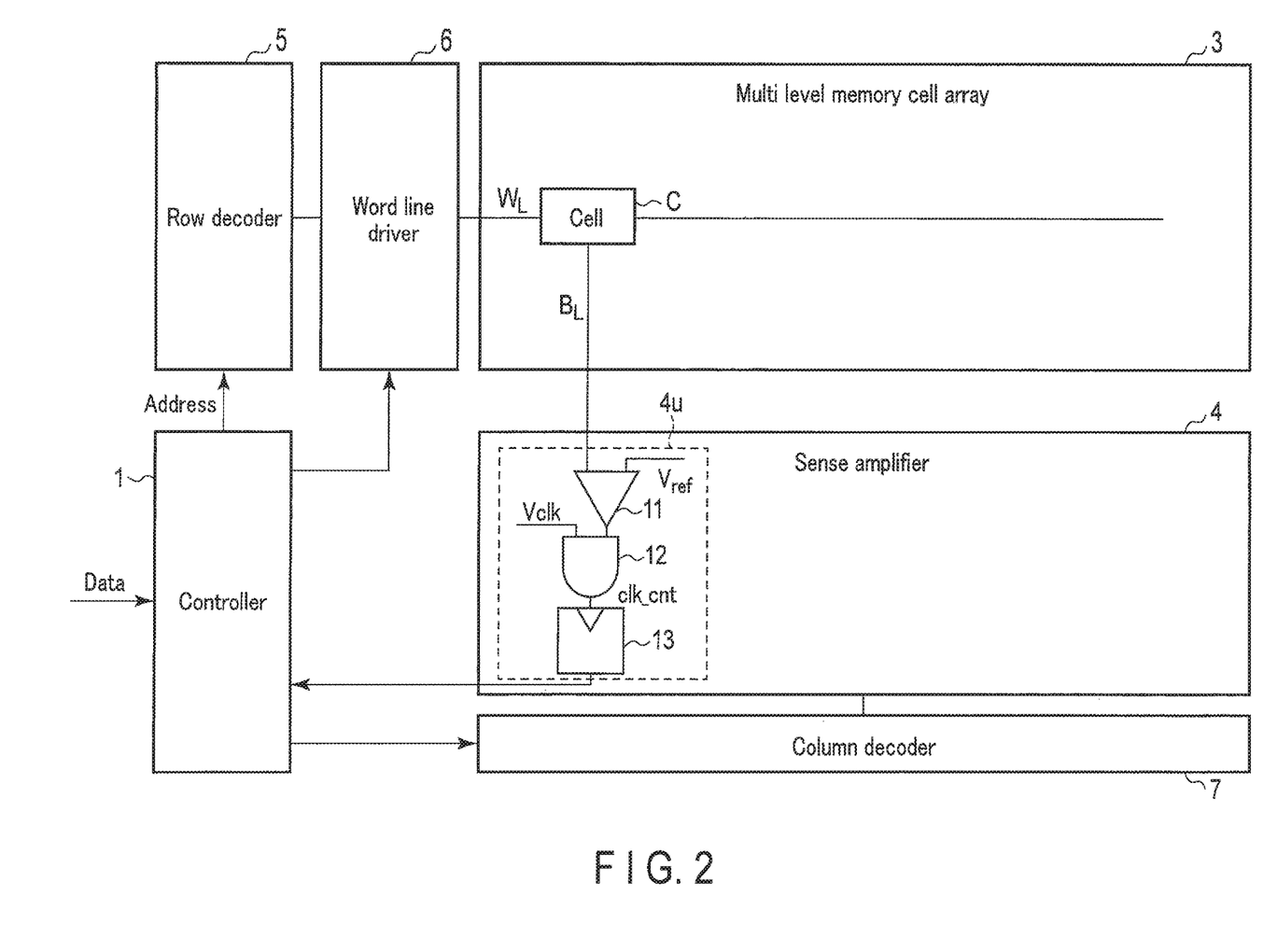
FIG. 2 is a diagram showing a configuration of a sense amplifier 4 according to the first embodiment.

FIG. 2 is a diagram showing a configuration of the sense amplifier 4 according to the first embodiment.

The multi level memory cell array 3 includes a plurality of memory cells C arranged in an array pattern, each of the memory cells C being capable of storing a multi level. A row decoder 5 decodes a row address based on an address signal from the controller 1. A word line driver 6 outputs a word line select signal that selects a word line WL of the row address decoded by the row decoder 5.

A column decoder 7 outputs a bit line select signal that selects a bit line BL based on an address signal from the controller 1.

The memory cell C is selected by the word line WL selected by the word line select signal, and the bit line BL is selected by the bit line select signal. Data is written in the selected memory cell C. In addition, the bit line voltage VBL of the written data is read from the selected memory cell C via the bit line BL.

The sense amplifier 4 is connected to the multi level memory cell array 3, and reads data corresponding to the multi level written in the selected memory cell C. The sense amplifier 4 includes a sense amplifier unit 4u. The sense amplifier unit 4u is provided for each bit line of the cell C of the multi level memory cell array 3. The sense amplifier unit 4u includes a sense amplifier 11, an AND circuit 12, and a clock counter 13.

The bit line voltage VBL of the bit line BL, to which the selected memory cell C is connected, is input to the sense amplifier 11. In addition, to another input of the sense amplifier 11, a reference voltage Vref is input.

The sense amplifier 11 compares the bit line voltage VBL with the reference voltage Vref. The sense amplifier 11 outputs a stop signal for stopping the clock counter 13 to the AND circuit 12 if the bit line voltage VBL is lower than the reference voltage Vref (i.e., if a corresponding memory cell C is on).

The clock voltage Vclk and output of the sense amplifier 11 are input to the AND circuit 12. The AND circuit 12 outputs the clock voltage Vclk to the clock counter 13 if the bit line voltage VBL is higher than the reference voltage Vref (i.e., if a corresponding memory cell C is off). In addition, the AND circuit 12 stops outputting the clock voltage Vclk to the clock counter 13 when the stop signal is input from the sense amplifier 11.

The clock counter 13 counts the clock voltage Vclk input from the AND circuit 12 and holds the number of counts until the stop signal is output from the sense amplifier 11. The number of counts held in the clock counter 13 is read by the controller 1.

When reading, the controller 1 steps up the word line voltage VWL of the word line WL of the selected memory cell C, in synchronization with counting of the clock counter 13 corresponding to the selected memory cell C.

The clock counter 13 stops counting based on the stop signal from the sense amplifier 11, and holds a count value. The controller 1 steps up the voltage of the word line select signal, in synchronization with the clock voltage Vclk.

The controller 1 reads the count value stored in the clock counter 13, and reads the data stored in the selected memory cell C based on the count value.

Figure 3:
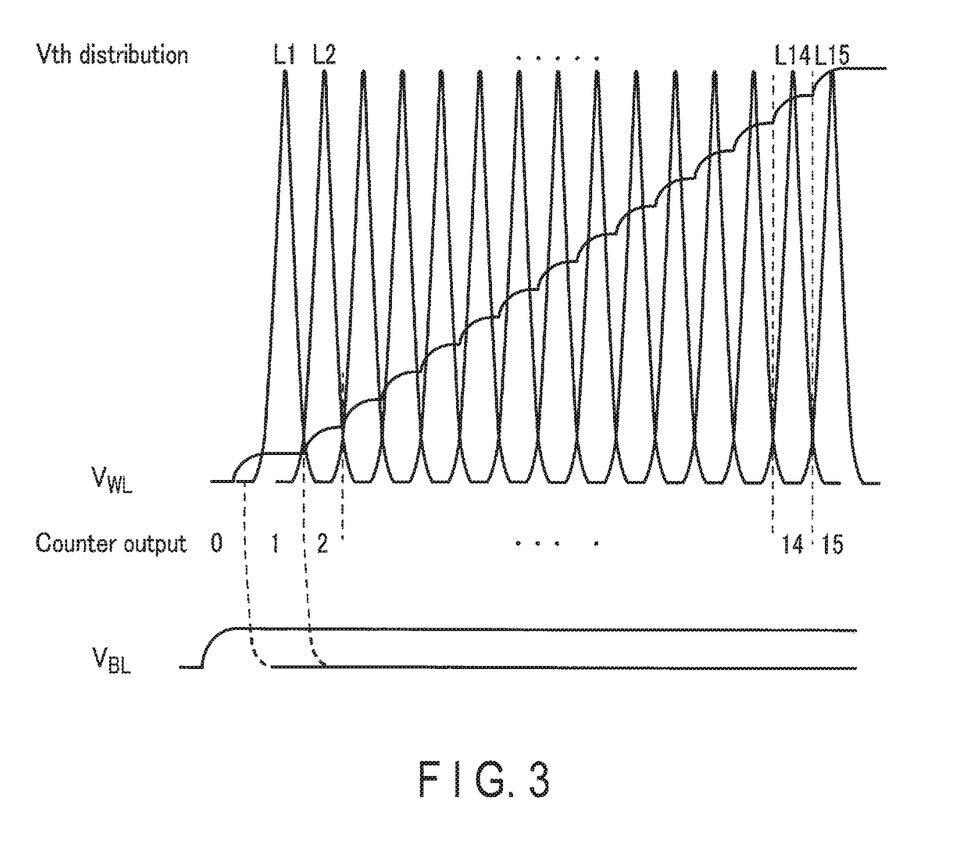
FIG. 3 is a diagram showing a relationship between a count value of a clock counter 13 and a bit line voltage VBL of a bit line BL.

FIG. 3 is a diagram showing a relationship between the count value of the clock counter 13 and the bit line voltage VBL of the bit line BL.

In FIG. 3, a multi level memory cell array capable of storing data of 16 level (4 bits) is described as an example. Fifteen threshold values (L1 to L15) exist in a transistor included in the memory cell C.

The controller 1 applies the word line voltage VWL of the word line WL of the selected memory cell C to a gate of a transistor of the selected memory cell C in steps, in synchronization with the clock voltage Vclk of the sense amplifier unit 4u corresponding to the selected memory cell C.

When the selected memory cell C is on, a current flows in the bit line BL of the selected memory cell C, and the bit line voltage VBL of the bit line BL decreases. The sense amplifier 11 of the sense amplifier unit 4u of the selected memory cell C compares the bit line voltage VBL of the bit line BL with the reference voltage Vref. If the bit line voltage VBL of the bit line BL is lower than the reference voltage Vref as a result of decrease in the bit line voltage VBL of the bit line BL, the sense amplifier 11 outputs the stop signal for stopping the clock counter 13 to the AND circuit 12.

The count value of the clock counter 13 stores values 0 to 15. Then, when the clock counter 13 stops counting by the stop signal, the count value is stored in the clock counter 13. The controller 1 reads the count value stored in the clock counter 13, and reads data stored in the selected memory cell C based on this read count value.

(1-2) Working Effect

Figure 4:
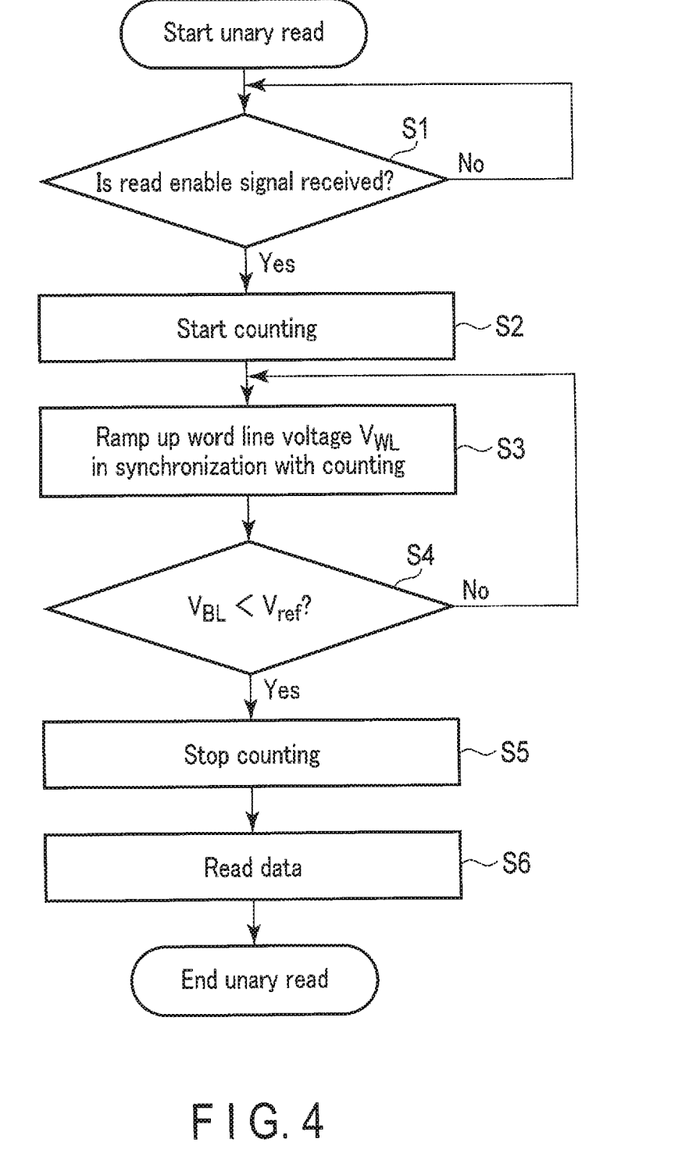
FIG. 4 is a flowchart for explaining a read operation of the semiconductor memory device according to the first embodiment.

FIG. 4 is a flowchart for explaining a read operation of the semiconductor memory device according to the first embodiment.

The controller 1 determines whether to receive a read enable signal (step S1). When the read enable signal is received, the controller 1 starts counting of the clock voltage Vclk by the clock counter 13 of the sense amplifier unit 4u corresponding to the selected memory cell C to be a read target (step S2).

Next, the controller 1 ramps up (or steps up) the word line voltage VWL of the word line WL of the selected memory cell C, in synchronization with the counting of the clock counter 13 (step S3).

The sense amplifier 11 of the sense amplifier unit 4u corresponding to the selected memory cell C determines whether the bit line voltage VBL of the bit line BL of the selected memory cell C is lower than the reference voltage Vref (step S4).

In step S4, if the bit line voltage VBL of the bit line BL of the selected memory cell C is lower than the reference voltage Vref, the controller 1 ramps up the word line voltage VWL of the word line WL of the selected memory cell C continuously, in synchronization with the counting of the clock counter 13 (step S3).

On the other hand, in step S4, if the bit line voltage VBL of the bit line BL of the selected memory cell C is lower than the reference voltage Vref, the sense amplifier 11 outputs the stop signal to the AND circuit 12, and stops the counting of the clock counter 13 (step S5).

The clock counter 13 stops counting when the stop signal is output from the sense amplifier 11. The controller 1 reads the data stored in the selected memory cell C based on the count value stored in the clock counter 13 (step S6).

(1-3) Advantageous Effect

According to the first embodiment, one data is stored in one multi level cell. This enables preventing data skipping due to an error of an upper significant bit.

In addition, in the embodiments, data stored in a multi level cell is read by unary search, like a single slope ADC.

In order to read a multi level cell efficiently, an upper significant bit should be searched first by the binary search. In this technique, when being influenced by noise, errors in data due to uncertainty of the sense amplifier would become too large to disregard, which largely affects the application.

In contrast, like the embodiments, errors in data can be reduced within an allowable range by performing read by the unary search.

Furthermore, according to the embodiments, since errors can be allowed while maintaining the reliability of data, it is possible to reduce the cost for a redundancy bit, etc. necessary for securing the high reliability of a multi level cell.

In addition, since data errors of a few LSBs can be allowed without correction, the cost for the ECC can be reduced.

Furthermore, since data can be read by one-time sensing per memory, a waiting time (latency) can be shortened.

Second Embodiment (2-1) Configuration

Figure 5:
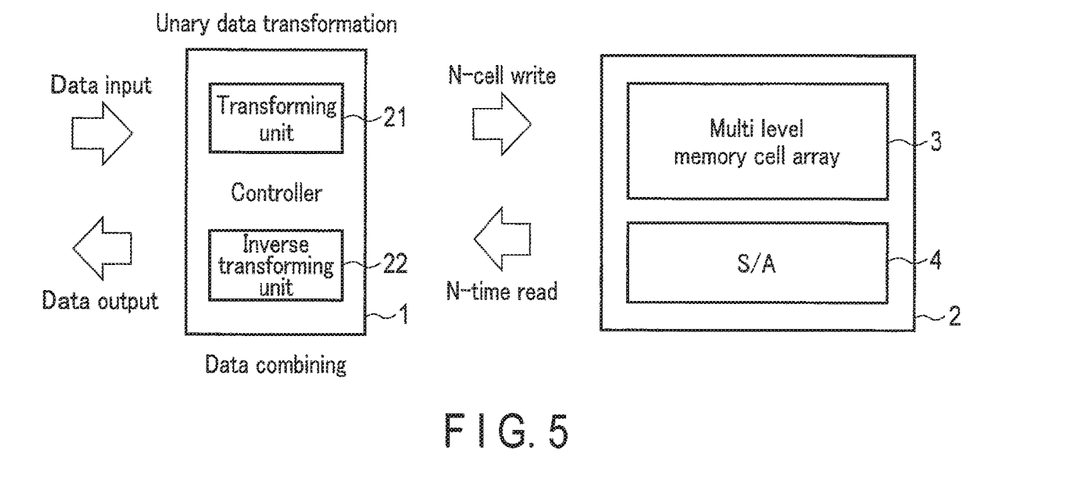
FIG. 5 is a diagram for explaining a semiconductor memory device according to a second embodiment.

FIG. 5 is a diagram for explaining the semiconductor memory device according to the second embodiment.

The difference from the controller 1 shown in FIG. 1 is that the controller 1 of the semiconductor memory device according to the second embodiment includes a transforming unit 21 for dividing the input data and an inverse transforming unit 22 that adds and outputs the data read from the multi level memory cell array 3.

The controller 1 divides the input data into N pieces (N: an integer of 2 or more) of data by the transforming unit 21, and writes these N pieces of divided data to N memory cells, respectively.

In addition, the controller 1 reads the data read from the multi level memory cell array 3 from the N memory cells C, respectively, and adds and outputs these N pieces of read data.

(2-2) Working Effect

Figure 6:
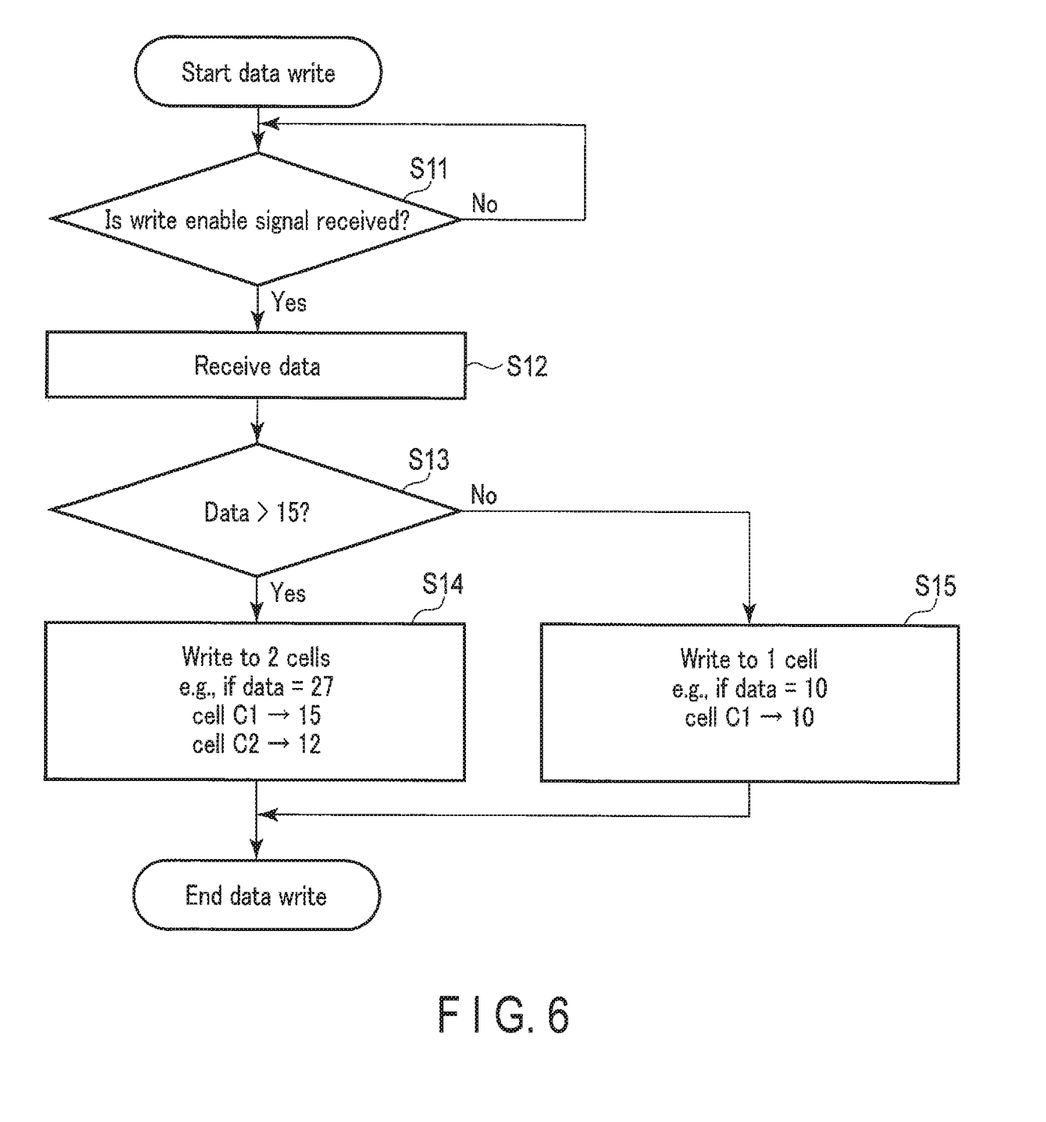
FIG. 6 is a flowchart for explaining a write operation of the semiconductor memory device according to the second embodiment.

FIG. 6 is a flowchart for explaining a write operation of the semiconductor memory device according to the second embodiment. In the second embodiment, it is assumed that any of the data 0 to 15, expressed by 4 bits, can be stored in one cell. In addition, the input data is any one of 0 to 31, expressed by 5 bits.

The controller 1 determines whether to receive a write enable signal (step S11). When the write enable signal is received, the controller 1 receives write data that is externally input (step S12).

The controller 1 determines whether the write data is larger than 15 (step S13). If the write data is larger than 15, the controller 1 performs writing to two cells of the multi level memory cell array 3 (step S14). For example, if the data is 27, the controller 1 writes 15 to the first one cell, 12 to the next one cell, and ends the writing of data.

If the write data is not larger than 15, the controller 1 performs writing to one cell of the multi level memory cell array 3 (step S14). For example, if the data is 10, the controller 1 writes 10 to one memory cell (step S15), and ends the writing of data.

Figure 7:
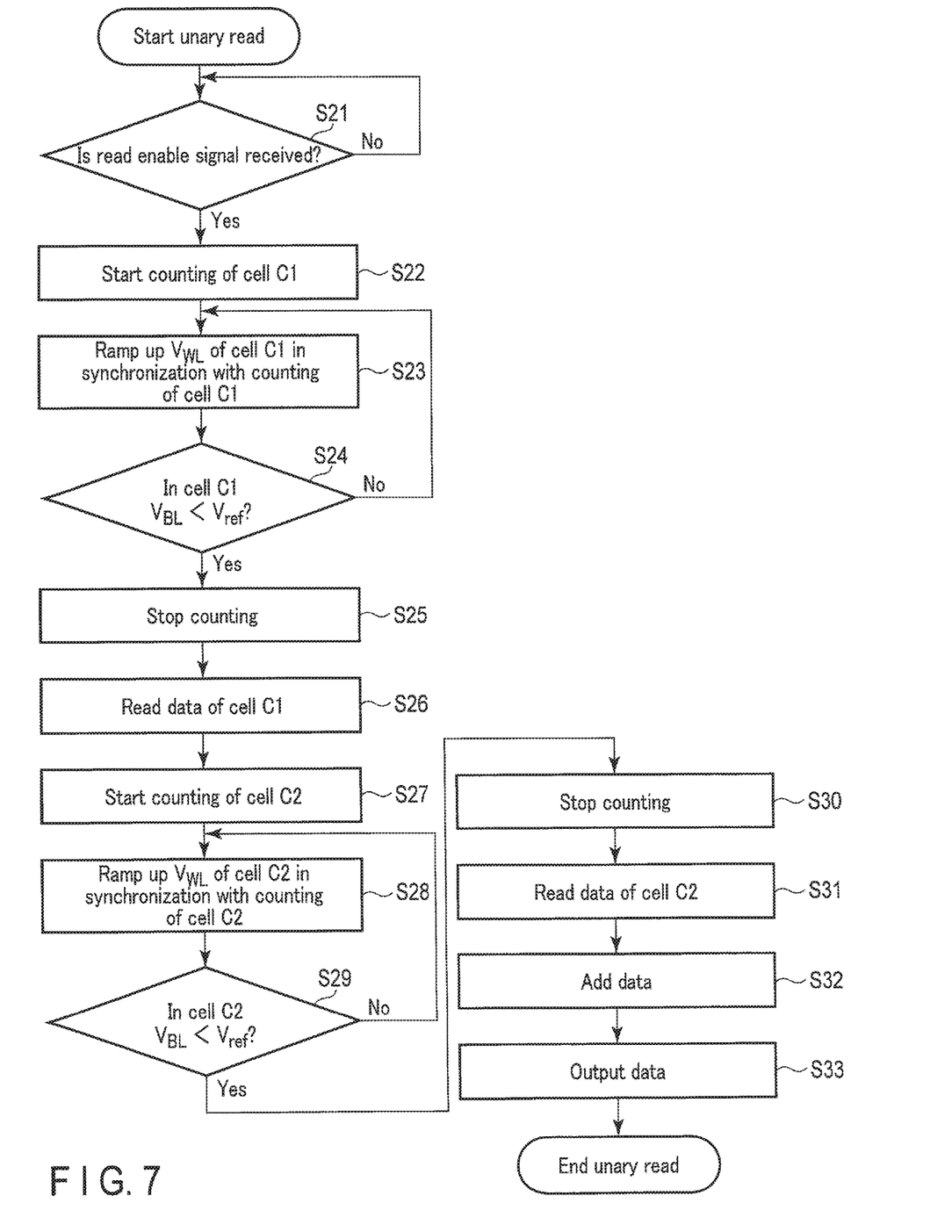
FIG. 7 is a flowchart for explaining a read operation of the semiconductor memory device according to the second embodiment.

FIG. 7 is a flowchart for explaining a read operation of the semiconductor memory device according to the second embodiment. As an example, an operation when one data is written to two memory cells will be described.

The controller 1 determines whether to receive a read enable signal (step S21). If the read enable signal is received, the controller 1 starts counting of the clock voltage Vclk by the clock counter 13 of the sense amplifier unit 4u corresponding to the selected memory cell C1 to be a read target (step S22).

The controller 1 ramps up the word line voltage VWL of the word line WL of the memory cell C1, in synchronization with the counting of the clock counter 13 of the sense amplifier unit 4u of the memory cell C1 (step S23).

The sense amplifier 11 of the sense amplifier unit 4u corresponding to the selected memory cell C1 determines whether the bit line voltage VBL of the bit line BL of the selected memory cell C1 is lower than the reference voltage Vref (step S24).

In step S24, if the bit line voltage VBL of the bit line BL of the selected memory cell C1 is not lower than the reference voltage Vref, the controller 1 continuously ramps up the word line voltage VWL of the word line WL of the selected memory cell C1, in synchronization with the counting of the clock counter 13 (step S23).

On the other hand, in step S24, if the bit line voltage VBL of the bit line BL of the selected memory cell C1 is lower than the reference voltage Vref, the sense amplifier 11 outputs the stop signal to the AND circuit 12, and stops the counting of the clock counter 13 (step S25).

The clock counter 13 stops counting when the stop signal is output from the sense amplifier 11. The controller 1 reads the data stored in the selected memory cell C1 based on the count value stored in the clock counter 13 (step S26).

Next, reading of data of the memory cell C2 is performed consecutively by the same method as that of the memory cell C1. An address of the memory cell C2 read subsequent to the memory cell C1 may be in a predetermined relationship (e.g., a consecutive address) with an address of the memory cell C1. Alternatively, the address can also be acquired by storing the addresses of the memory cell C1 and the memory cell C2 in a table when writing data, and referring to the table when reading.

Then, counting of the clock voltage Vclk by the clock counter 13 of the sense amplifier unit 4u corresponding to the selected memory cell C2 consecutively read subsequent to the memory cell C1 is started (step S27).

The controller 1 steps up the word line voltage VWL of the word line WL of the memory cell C2, in synchronization with the counting of the clock counter 13 of the sense amplifier unit 4u of the memory cell C2 (step S28).

The sense amplifier 11 of the sense amplifier unit 4u corresponding to the selected memory cell C2 determines whether the bit line voltage VBL of the bit line BL of the selected memory cell C2 is lower than the reference voltage Vref (step S29).

In step S29, if the bit line voltage VBL of the bit line BL of the selected memory cell C2 is not lower than the reference voltage Vref, the controller 1 continuously ramps up the word line voltage VWL of the word line WL of the selected memory cell C2, in synchronization with the counting of the clock counter 13 (step S28).

On the other hand, in step S29, if the bit line voltage VBL of the bit line BL of the selected memory cell C2 is lower than the reference voltage Vref, the sense amplifier 11 outputs the stop signal to the AND circuit 12, and stops the counting of the clock counter 13 (step S30).

The clock counter 13 stops counting when the stop signal is output from the sense amplifier 11. The controller 1 reads the data stored in the selected memory cell C2 based on the count value stored in the clock counter 13 (step S31).

The controller 1 adds the data read from the memory cell C1 and the data read from the memory cell C2 (step S32), and outputs the added data (step S33) so as to end the reading of the data.

In the embodiments, if the size of one data is a size storable in one memory cell, writing and reading are performed on one memory cell. If the size of one data is a size storable in a plurality of memory cells, writing and reading are performed on a plurality of memory cells.

A determination criterion of whether to write to one memory cell or a plurality of memory cells is stored in a table that can be referred to by the controller 1. When writing the data, the controller 1 stores the type of writing (e.g., 1-cell writing, 2-cell writing, 3-cell writing, etc.) in the table in association with a physical address of a memory cell. When reading, the controller 1 performs reading of one memory cell, or consecutive reading of a plurality of memory cells, according to the type of writing corresponding to the physical address of the memory cell.

A method of reading one memory cell is the same as the method described in the first embodiment. In addition, if reading is performed on N cells in which data can be written, the controller 1 sequentially reads data from cells C1, C2, . . . , and CN, in the second embodiment. Furthermore, the controller 1 adds and outputs data read from the cells C1, C2, . . . , and CN.

In addition, addition processing can be performed in one sense amplifier unit 4u by arranging the cells C1 and C2 on the same bit line BL. Thus, data addition processing in step S32 can be omitted.

(2-3) Advantageous Effect

According to the semiconductor memory device of the second embodiment, in addition to the effect of the first embodiment, it is possible to handle multi level data with a larger number of bits than that of the multi level of the memory cell, while suppressing the cost for the ECC.

[Modification]

(3-1)

A value stored in the clock counter 13 does not need to be a count value, and may be a count corresponding value that corresponds to the count value. The controller 1 may recognize the data stored in the memory cell C based on the count corresponding value stored in the clock counter 13.

(3-2)

In the first and second embodiments, a non-volatile memory, such as a NAND flash memory, is described as an example of the memory 2, but the memory 2 may be a volatile memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory that includes a plurality of memory cells, wherein each of the memory cells can store a multi level indicating one data;
   a controller that writes the multi level to one cell of the memory; and
   a sense amplifier that performs unary read of data from the multi level written in the one cell,
   wherein the data is data in which an error of a predetermined lower significant bit is allowed, and
   the controller reads data indicated by the multi level stored in the one cell of the memory from the sense amplifier.

2. The semiconductor memory device of claim 1, wherein the data is data for inference of deep learning.

3. The semiconductor memory device of claim 1, wherein the sense amplifier is a single slope ADC or a flash ADC.

4. The semiconductor memory device of claim 1, wherein the memory is any one of a NAND flash memory, a resistance change type memory (ReRAM), and a phase change memory (PCM).

* * * * *